(12) United States Patent
Cheng et al.

(10) Patent No.: US 7,248,474 B2
(45) Date of Patent: Jul. 24, 2007

(54) FOOL-PROOF DEVICE ON HEATSINK THERMAL MODULE FOR THE NOTEBOOK COMPUTER

(75) Inventors: Yi-Lun Cheng, Taipei (TW); Chih-Kai Yang, Taipei (TW)

(73) Assignee: Inventec Corporation (TW)

( * ) Notice: Subject to any disclaimer, the term of this patent is extended or adjusted under 35 U.S.C. 154(b) by 188 days.

(21) Appl. No.: 11/140,085

(22) Filed: May 27, 2005

(65) Prior Publication Data

US 2006/0082968 A1    Apr. 20, 2006

(30) Foreign Application Priority Data

Oct. 15, 2004    (TW) ............................... 93216477 U

(51) Int. Cl.
*H05K 7/20* (2006.01)

(52) U.S. Cl. ...................... 361/695; 361/715; 361/719; 73/1.79; 73/760; 29/832; 29/592.1

(58) Field of Classification Search ................ 361/683, 361/697, 688, 689, 701–719; 257/706, 718, 257/719, 722, 727; 174/16.1, 16.3; 165/80.3, 165/185; 73/760, 763–765, 767, 488, 493, 73/510, 514.35; 29/592.1, 593, 832, 833, 29/834
See application file for complete search history.

(56) References Cited

U.S. PATENT DOCUMENTS

| | | | |
|---|---|---|---|
| 6,606,788 B1* | 8/2003 | Morimoto et al. | 29/832 |
| 6,724,628 B2* | 4/2004 | Franz et al. | 361/704 |
| 6,915,699 B2* | 7/2005 | Hsiao | 73/760 |
| 7,040,137 B1* | 5/2006 | Gieskes | 73/1.79 |

\* cited by examiner

*Primary Examiner*—Michael Datskovskiy
(74) *Attorney, Agent, or Firm*—Raymond J. Ho; Venable LLP

(57) ABSTRACT

A fool-proof device on the heatsink thermal module for the notebook computer is provided. With an interference member installed on one side of the case of the heatsink thermal module, when installing the heatsink thermal module, the interference member and a predetermined recognition area on the printed circuit board (PCB) can provide a fool-proof function to avoid assembling error of two modules with different standard but similar in appearance in the assembling process.

9 Claims, 7 Drawing Sheets

FOOL-PROOF DEVICE ON HEATSINK THERMAL MODULE FOR THE NOTEBOOK COMPUTER

This application claims benefit of priority to Taiwan patent application Ser. No. 093216477, filed on Oct. 15, 2004, entitled "FOOL-PROOF DEVICE ON HEATSINK THERMAL MODULE FOR THE NOTEBOOK COMPUTER" which is incorporated herein by reference in its entirety.

BACKGROUND OF THE INVENTION

1. Field of the Invention

This invention relates to a structural improvement of the heatsink thermal module of a computer, and particularly a heatsink thermal module for the notebook computer having fool-proof function.

2. Description of the Related Art

The progress in information technology has made the notebook computers being widely used. With upgrading in the operation and operation speed of the electronic components, such as Central Processing Unit (CPU) and Video Graphics Array (VGA) chips, the high-speed and mass operation of these electronic components are accompanied by the problem of high temperature generated. However, electronic component has its working limit temperature. High temperature will affect the working efficiency and, more seriously, lead to a damage or combustion of an electronic component. Thus, the heat dissipation function becomes indispensable to the design of a product, and in order to let computers work below a presetting temperature, the heatsink thermal module has becomes an indispensable component to a computer.

Nowadays, the factories have usually some special designs on certain parts in the production of notebook computers to meet clients' demand for specific functions. Since most of designs remain the same or interchangeable, the same modules can therefore be used in different models, especially while many models have merely slight difference in the function or standard, the modules only need some little modification. Moreover, in order to reduce manufacturing cost, factories will try their best to repeatedly use the same modules when they design their products to lower the manufacture, material management and inventory cost of the modules.

Although it can effectively lower the manufacture, material management and inventory cost of modules by repeated using similar modules, the operators on the manufacturing line often misuse the modules and thus result in assembling errors. The defective products need therefore to be re-worked and re-tested, which, on the contrary, results in the increase of the complexity and the cost for the manufacturing. Hence, preventing assembling error without sedulous artificial identification by the operators while using similar modules during the manufacturing becomes an urgent task.

Notebook computers often have the same product structure without using identical type of CPU or VGA chip. The difference in operation speed or efficiency of CPU or VGA models is mainly designed to meet the demand of different clients. However, different models of CPUs or VGA chips have different requirement for thermal dissipation. For example, Model A requires a thermal dissipation efficiency of 50 W while Model B requires 70 W, the heatsink thermal modules used by the two models will be different. As shown in FIG. 1 and FIG. 2, a perspective view of a heatsink thermal module having a single heat pipe and double heat pipes respectively used on the Model A and Model B with the thermal dissipation efficiency requirement of 50 W and 70 W. While there is no significant difference in the appearance of the two heatsink thermal modules and only the number of heat pipes under the upper case is different, the assembling error often occurs during manufacturing because of the difficulty of recognition by worker.

SUMMARY OF THE INVENTION

It is an object to provide a fool-proof device on the heatsink thermal module for the notebook computer. During the assembling process of a heatsink thermal module of the computer, especially the notebook computer, different standards of heatsink thermal modules with similar appearance can be correctly installed on the Printed Circuit Board (PCB) by an interference member and without human recognition to achieve the objective of one hundred percent fool-proof.

To achieve the object, the invention of fool-proof device on the heatsink thermal modules for the notebook computer provides an interference member on one side of the case of the heatsink thermal module. The interface member with a predetermined recognition area on the PCB provides a function of fool-proof recognition.

In the installation process of heatsink thermal module to the PCB, if the interference member is not blocked on the recognition area of a PCB by a block, the heatsink thermal module can hence be installed on the PCB, which means operator uses a correct PCB. On the other hand, if a heatsink thermal module is to be installed on a PCB with a preset block on its recognition area, the interference member will be blocked and the heatsink thermal module will be unable to be installed on the PCB, which means operator uses an incorrect PCB. As a result, the modules with different standards but similar in appearance can be recognized during the installation and the assembling error in the manufacturing process can thus be avoided.

By means of the embodiment of the disclosed invention, at least the following objects can be achieved.
1. The assembling error resulting from the misuse of similar heatsink thermal modules during the manufacturing process can be avoided.
2. The invention provides a one hundred percent fool-proof function without human recognition.
3. Defective products resulting from misuse of similar heatsink thermal modules can be eliminated and the complexity and cost of manufacturing can be reduced.

For better knowledge and understanding of characteristics, purposes and functions of the disclosed invention, the detailed descriptions are as follows:

DETAILED DESCRIPTION OF THE INVENTION

Figure 1:
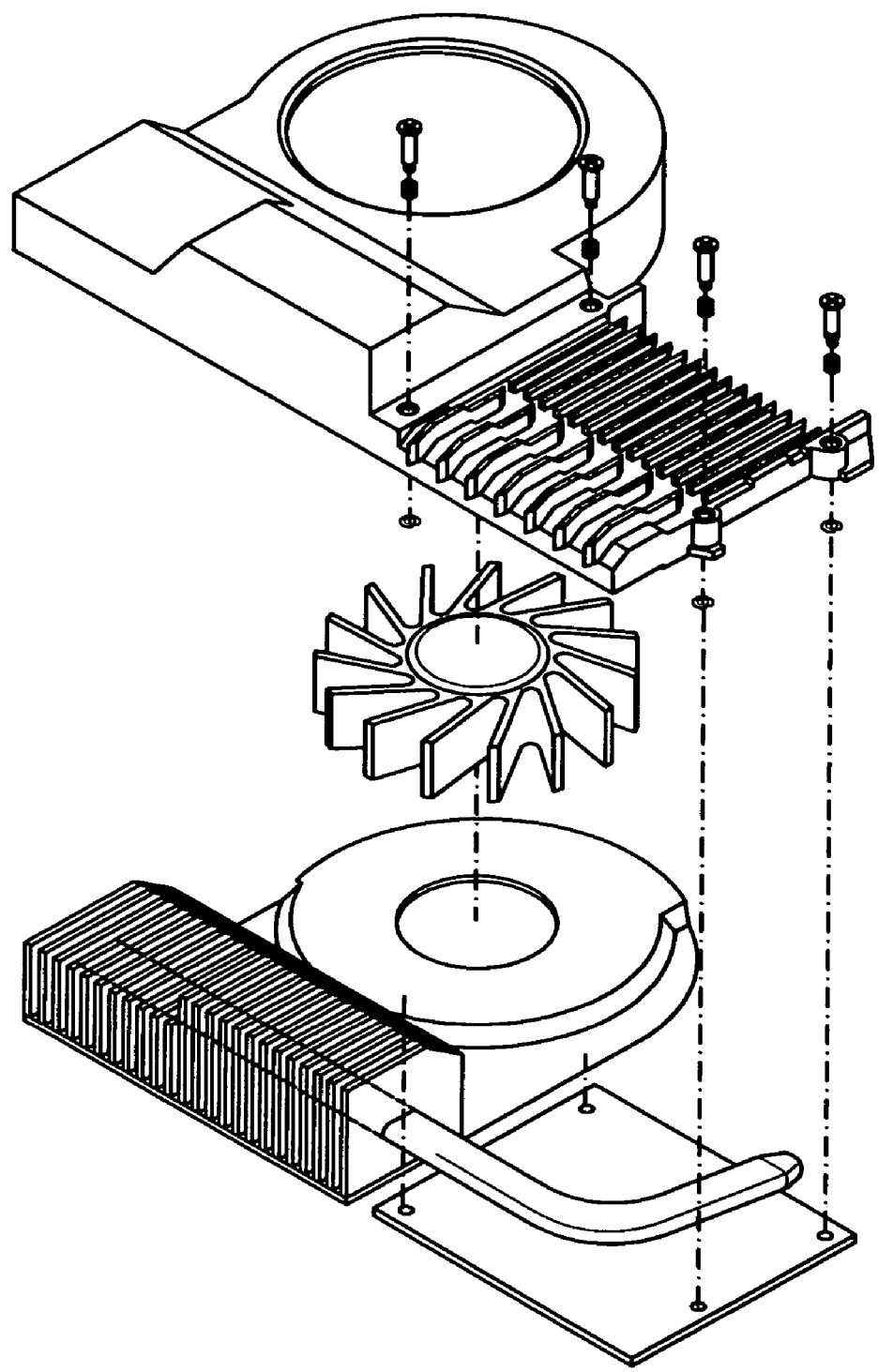
FIG. 1 is a perspective view of a conventional heatsink thermal module with a single heat pipe.
Figure 2:
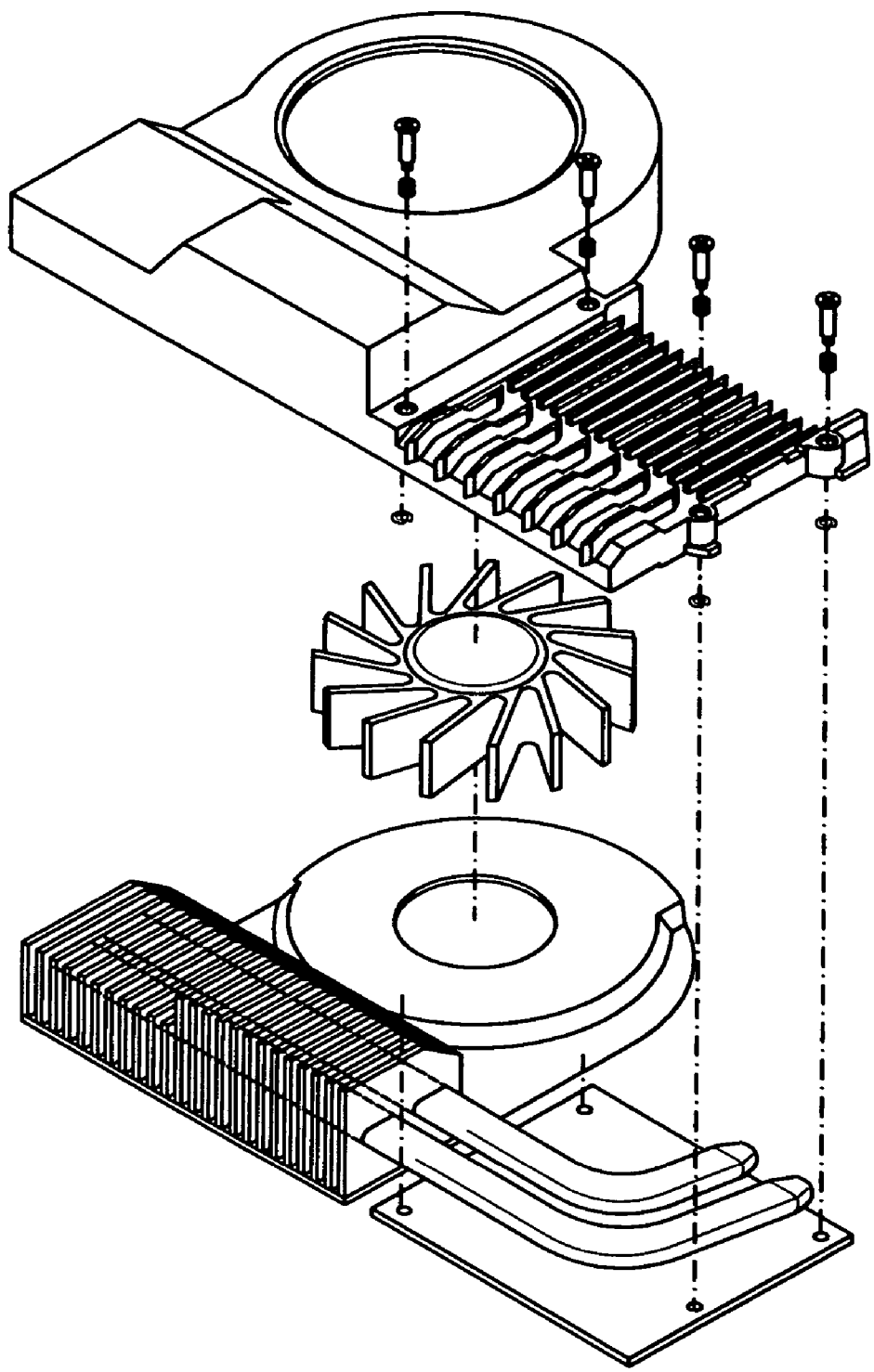
FIG. 2 is a perspective view of a conventional heatsink thermal module with double heat pipes.
Figure 3:
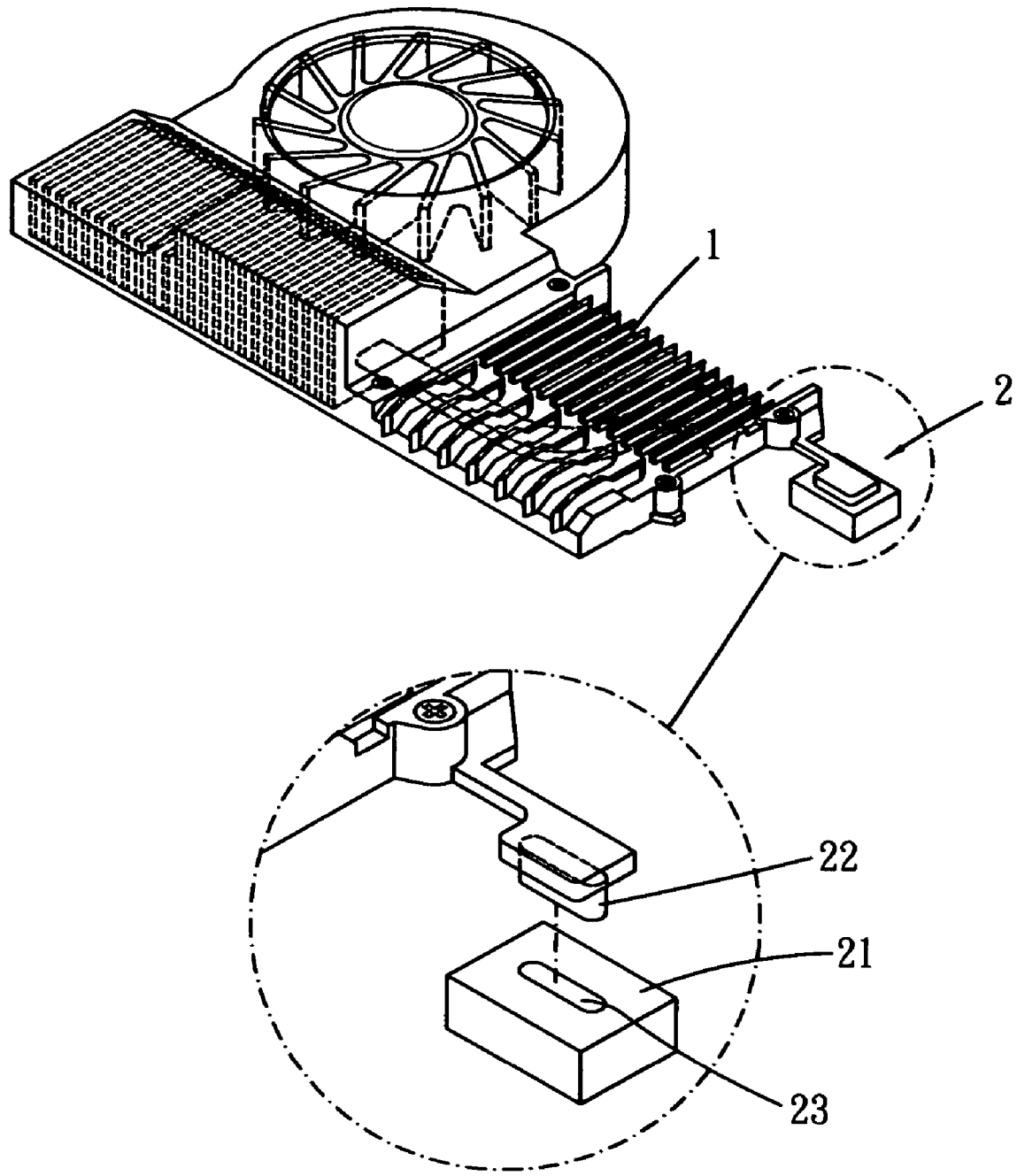
FIG. 3 is a three-dimensional view of a preferred embodiment of the invention.
Figure 4:
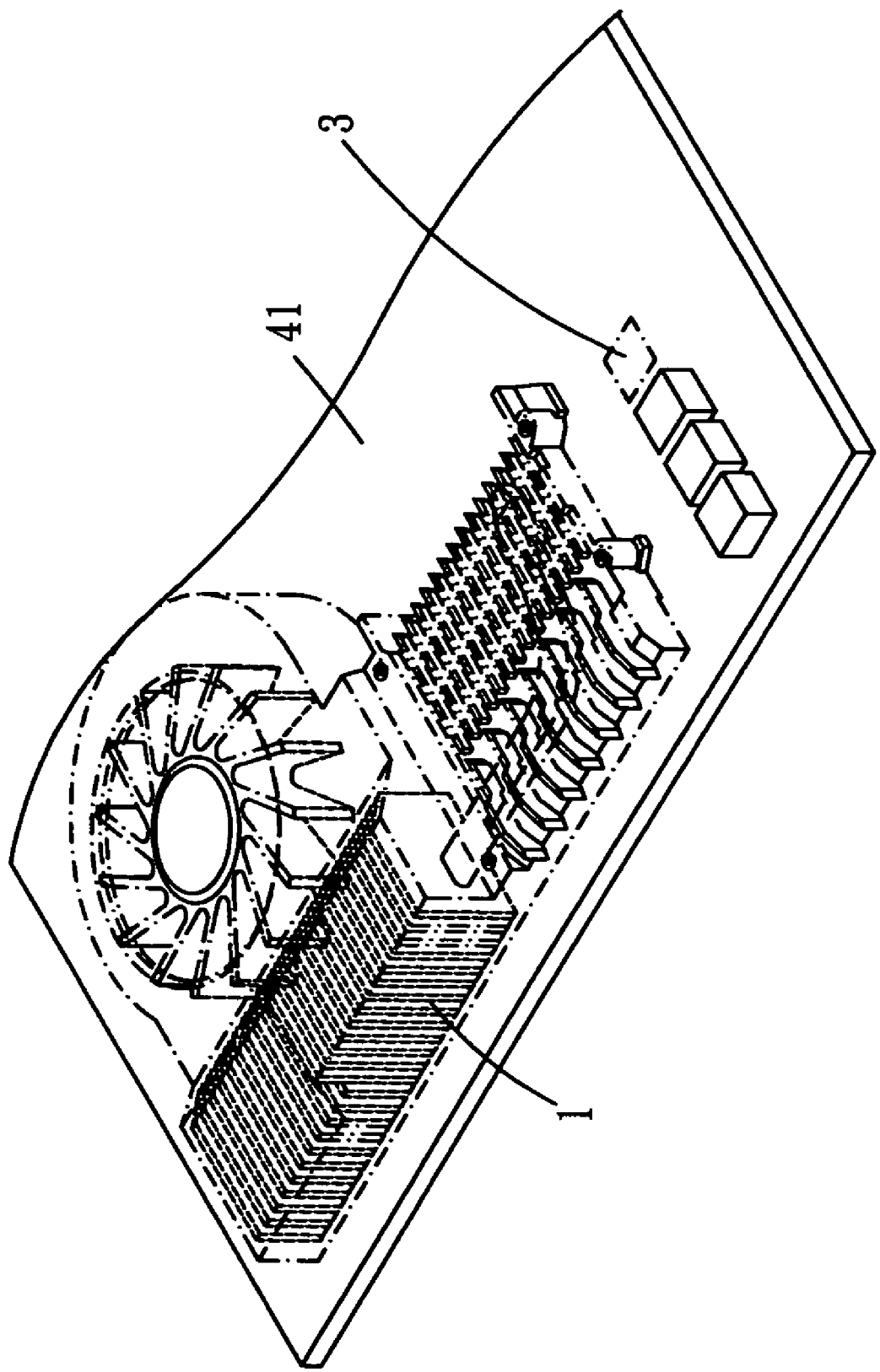
FIG. 4 is a view showing a first PCB without a block of the preferred embodiment of the invention.
Figure 5:
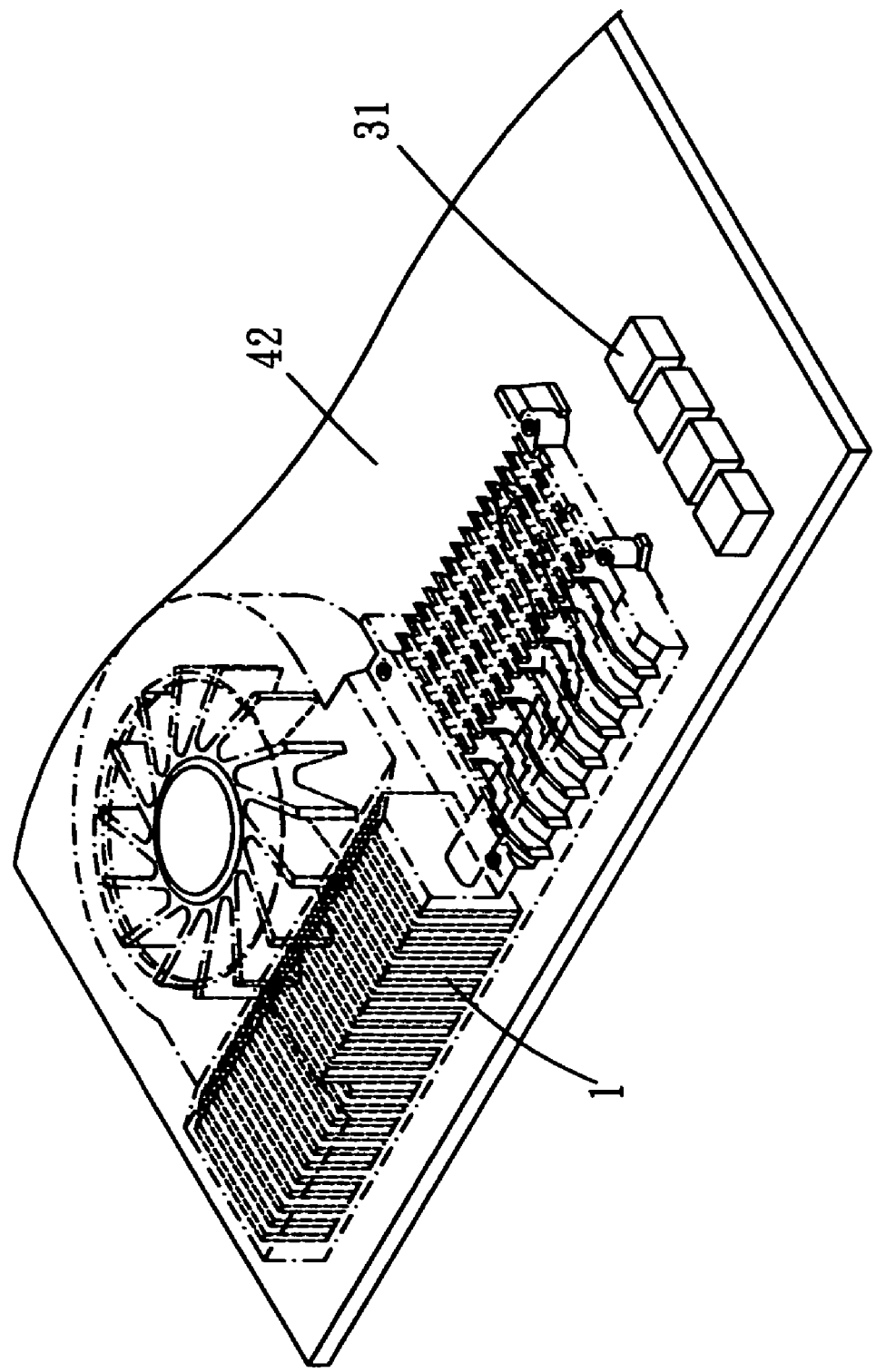
FIG. 5 is a view showing a second PCB with a block of the preferred embodiment of the invention.

As shown in FIG. 3, FIG. 4 and FIG. 5, FIG. 3 is a 3D view of a preferred embodiment of the invention. FIG. 4 is a view showing a first PCB without a block and FIG. 5 is a view showing a second PCB with a block. For a fool-proof device on the heatsink thermal module for the notebook computer, an interference member 2 is installed on one side of the case of the heatsink thermal module 1. When an operator installs the heatsink thermal module 1 to a PCB, the interference member 2 and a preset recognition area 3 on the PCB can provide a fool-proof recognition function to avoid assembling error resulting from the misuse of two similar heatsink thermal modules During the installation of a heatsink thermal module 1 to a PCB for assembling a computer, an interference member 2 is installed on one side of the case of the heatsink thermal module 1. The heatsink thermal module 1 can be installed on a correct PCB if there is no block 31 to block the interference member 2 on the recognition area 3 of the PCB.

When a heatsink thermal module 1 is installed on a PCB, an incorrect PCB, with a block 31 preset on the recognition area 3 of the PCB, the interference member 2 will be blocked by the block 31. Thus, the heatsink thermal module 1 can not be installed on the PCB. The assembling error of two similar heatsink thermal modules during manufacturing can therefore be avoided.

The interference member 2 is a protruding body installed according to the position of the recognition area 3 of the PCB; it can be fabricated as One-body shape during the fabrication of the upper case of the heatsink thermal module 1. The working principle of the interference member 2 is utilizing its thickness to achieve an interfere function. If a heatsink thermal module 1 is installed on an incorrect PCB, the interference member 2 will be blocked by the block 31 of the PCB, and thus there is no strict constraint on the shape of the interference member 2. The block 31 is an entity and can be, optionally, installed or not installed on the recognition area 3. The working principle of the block 31 is utilizing its thickness to achieve an interfere function. If a heatsink thermal module 1 is installed on an incorrect PCB, the interference member 2 will be blocked by the block 31, and thus there is no strict constraint of the shape.

For efficient utilization of the space and avoiding worthless components on the computer, the block 31 can be an electronic component on the PCB, which means that the electronic component has not only a specific function on the PCB but also a block function. On the other hand, concussion during the installation of the heatsink thermal module 1 is inevitable, so an electronic component choosing as a block 31 must stand any concussion during the installation; the block 31 chosen in this embodiment is an inductance with shell.

Because the upper case of the heatsink thermal module 1 is made of a metal, the interference member 2 which is fabricated with the heatsink thermal module 1 as One-body shape is also made of a metal. In such a case, if the block 31 is not fully insulated, it may cause circuit problems. Hence a buffer 21 is combined to the interference member 2 in this embodiment; the buffer 21 is a rectangular body made of rubber, so it has the effects of insulation and play as a shock absorber, which allows the excellent insulation and the diminution of damage caused by the concussion during assembling.

The combination of the buffer 21 can attain the objective of insulation and shock absorbing. But, if it is not firmly combined with the interference member 2 and easy to flake off during the assembling, it may, on the contrary, cause inconveniences to the assembling operation. Thus, the interference member 2 can furthermore be designed as a flat board, so the buffer 21 can be glued on the top; or during the fabrication of the interference member 2 by the way of One-body shape, at the same time a geometric pillar 22 can be formed under the center of the flat board of the interference member 2, whereas a socket 23 can be designed at the center of the buffer 21 according to the position of the geometric pillar 22 to tightly combine with the geometric pillar 22 and allows the perfect combination of the interference member 2 and the buffer 21 by plugging in and gluing together the geometric pillar 22 and the socket 23 which makes the combination even more solid.

Figure 6:
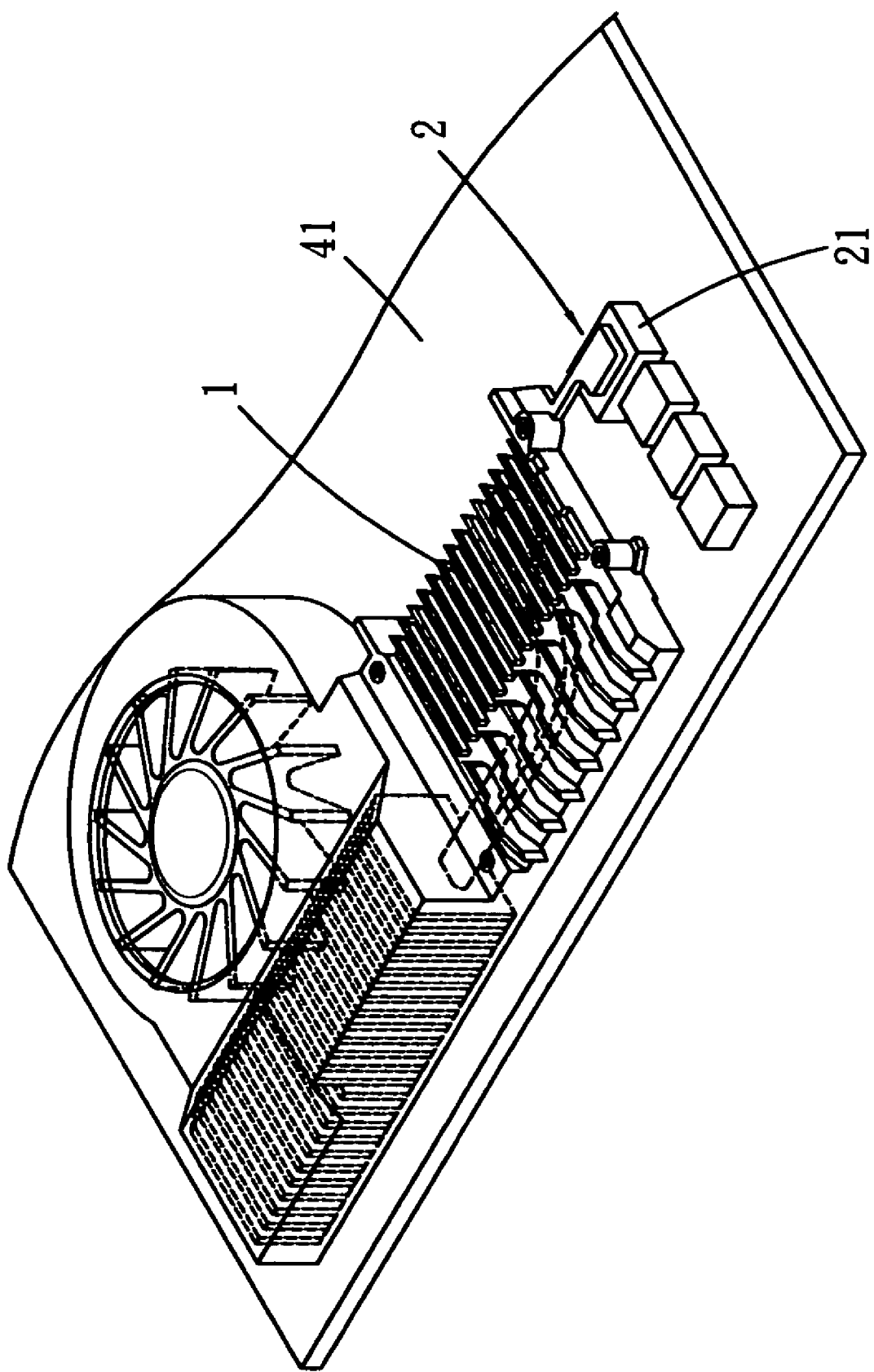
FIG. 6 is a view showing a correct installation of the heatsink thermal module of the preferred embodiment of the invention.
Figure 7:
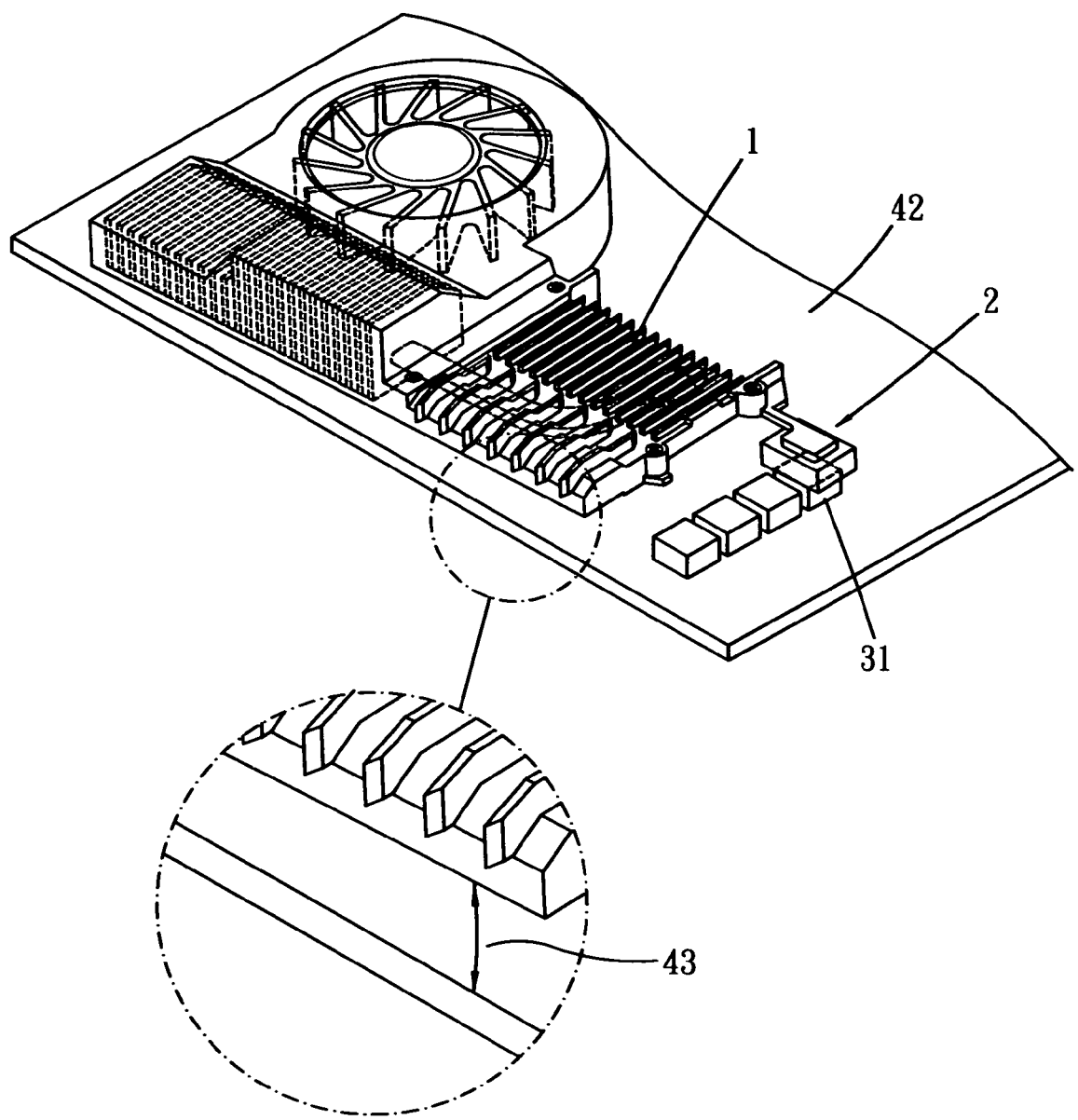
FIG. 7 is a view showing an incorrect installation of the heatsink thermal module of the preferred embodiment of the invention.

For further knowledge and understanding of this embodiment, the using direction is illustrated as follows: as shown in FIG. 4 and FIG. 5 which demonstrate respectively the first PCB embodiment of this invention without a block and the second PCB embodiment of this invention with a block. The requirement of thermal dissipation efficiency of the first PCB 41 is 50 W and the requirement of thermal dissipation efficiency of the second PCB 42 is 70 W. The thermal dissipation efficiency of the heatsink thermal module 1 in this embodiment is 50 W; as shown in FIG. 6 which illustrates the embodiment of this invention showing a correct installation of the heatsink thermal module 1. When the heatsink thermal module 1 is installed on the first PCB 41, because the recognition area 3 of the first PCB 41 has no block 31, the interference member 2 is not blocked and the heatsink thermal module 1 can correctly be assembled; as shown in the FIG. 7 which illustrates an embodiment of this invention showing an incorrect installation of the heatsink thermal module 1. When the heatsink thermal module 1 is installed on the second PCB 42, because the recognition area 3 of the second PCB 42 has a block 31, the interference member 2 is blocked by the block 31. Besides, the heatsink thermal module 1 and the second PCB 42 form an included angle which hinders the screw fixing hole of the heatsink thermal module 1 to reach the corresponding position and hence the screwing operation can not be done; the operators can therefore discover the problem and avoid the assembling error happening. Thus it is clear that, this invention shows obvious effect comparing to the conventional technology.

What is claimed is:

1. A fool-proof device on a heatsink thermal module for a notebook computer, comprising:
   a case of the heatsink thermal module; and
   an interference member installed on one side of the case of the heatsink thermal module, the interference member is a flat board for further combination with a buffer;
   wherein said interference member is to provide a fool-proof function during the installation of the heatsink thermal module.

2. The fool-proof device as claimed in claim 1 wherein the interference member is a protruding body with sufficient thickness for providing an interference function.

3. The fool-proof device as claimed in claim 1, wherein the interference member is installed corresponding to a recognition area of a PCB.

4. The fool-proof device as claimed in claim 1, wherein the interference member and the case are one-shaped structures.

5. The fool-proof device as claimed in claim 1, wherein the interference member and the buffer are combined by means of glue.

6. The fool-proof device as claimed in claim 1, further comprising a downward geometric pillar positioned under the center of the flat board and the buffer is a socket to be tightly combined with said geometric pillar.

7. The fool-proof device as claimed in claim 6, wherein the interference member and the geometric pillar are one-shaped structures.

8. The fool-proof device as claimed in claim 1, wherein the buffer is a rectangular body.

9. The fool-proof device as claimed in claim 6, wherein the socket and the geometric pillar are combined by means of plugging in and glue.

* * * * *